(12) United States Patent
Yoshino et al.

(10) Patent No.: US 10,851,236 B2
(45) Date of Patent: Dec. 1, 2020

(54) COMPOSITION FOR THERMALLY CONDUCTIVE MATERIAL AND THERMALLY CONDUCTIVE MATERIAL

(71) Applicant: KITAGAWA INDUSTRIES CO., LTD., Aichi (JP)

(72) Inventors: Hiroto Yoshino, Kasugai (JP); Teruaki Yuoka, Kasugai (JP)

(73) Assignee: KITAGAWA INDUSTRIES CO., LTD., Aichi (JP)

(*) Notice: Subject to any disclaimer, the term of this patent is extended or adjusted under 35 U.S.C. 154(b) by 0 days.

(21) Appl. No.: 16/617,053

(22) PCT Filed: Jun. 1, 2018

(86) PCT No.: PCT/JP2018/021154
§ 371 (c)(1),
(2) Date: Nov. 26, 2019

(87) PCT Pub. No.: WO2018/221719
PCT Pub. Date: Dec. 6, 2018

(65) Prior Publication Data
US 2020/0115538 A1   Apr. 16, 2020

(30) Foreign Application Priority Data

Jun. 2, 2017 (JP) .................................. 2017-109732
May 30, 2018 (JP) .................................. 2018-103841

(51) Int. Cl.
C08L 33/14 (2006.01)
C08J 3/20 (2006.01)
C08J 3/24 (2006.01)

(52) U.S. Cl.
CPC .............. *C08L 33/14* (2013.01); *C08J 3/203* (2013.01); *C08J 3/24* (2013.01); *C08J 2333/14* (2013.01); *C08J 2427/18* (2013.01); *C08J 2433/14* (2013.01); *C08L 2205/025* (2013.01); *C08L 2205/03* (2013.01)

(58) Field of Classification Search
CPC .............. C08L 33/14; C08L 2205/025; C08L 2205/03; C08J 3/203; C08J 3/24; C08J 2427/18; C08J 2333/14; C08J 2433/14
See application file for complete search history.

(56) References Cited

U.S. PATENT DOCUMENTS

| 7,208,192 B2 | 4/2007 | Bunyan et al. |
| 8,119,191 B2 | 2/2012 | Bunyan et al. |
| 9,029,435 B2 | 5/2015 | Tanaka |
| 9,371,474 B2 | 6/2016 | Schall et al. |
| 2007/0230131 A1 | 10/2007 | Bunyan et al. |
| 2012/0175549 A1* | 7/2012 | Yoshihara ............... C08L 67/02 252/79 |
| 2013/0253143 A1* | 9/2013 | Takeda ................... C08L 55/005 525/330.3 |
| 2014/0045963 A1 | 2/2014 | Tanaka |
| 2014/0283983 A1 | 9/2014 | Schall et al. |

FOREIGN PATENT DOCUMENTS

| JP | 2006-278476 | * 10/2006 ............ C08F 290/00 |
| JP | 2009-67950 | 4/2009 |
| JP | 2009-179743 | 8/2009 |
| JP | 2010-242022 | 10/2010 |
| JP | 2012-229338 | 11/2012 |
| JP | 2014-526585 | 10/2014 |
| JP | 2015-71719 | 4/2015 |
| JP | 2015-89911 | 5/2015 |
| JP | 2015-140395 | 8/2015 |
| WO | 2012/043426 | 4/2012 |

OTHER PUBLICATIONS

International Search Report (ISR) dated Aug. 28, 2018 in International Application (PCT) No. PCT/JP2018/021154.

* cited by examiner

*Primary Examiner* — Robert D Harlan
(74) *Attorney, Agent, or Firm* — Wenderoth, Lind & Ponack, L.L.P.

(57) ABSTRACT

Provided is a grease-like thermally conductive material having excellent heat resistance including a non-silicone resin.

Resolution Means:

The composition for thermally conductive material of the present invention includes: an acrylic polymer (A) having at least two crosslinkable functional groups containing a carbon-carbon unsaturated bond; an acrylic polymer (B) having at least one of the crosslinkable functional groups; an anti-dripping agent; and a thermally conductive filler, a discharge amount being 1.50 g/min or more and 4.25 g/min or less as measured using a dispense controller under a predetermined discharge pressure condition.

12 Claims, 3 Drawing Sheets

COMPOSITION FOR THERMALLY CONDUCTIVE MATERIAL AND THERMALLY CONDUCTIVE MATERIAL

TECHNICAL FIELD

The present invention relates to a composition for thermally conductive material and a thermally conductive material.

BACKGROUND ART

There are known grease-like thermally conductive materials that are used in the form of being filled in a small gap or the like formed between a heat generating body and a heat radiating body (for example, see Patent Documents 1 to 3). Grease-like thermally conductive materials are widely used in recent years because of their excellent adhesion and the high degree of freedom in the size and shape of gaps that can be filled.

The thermally conductive material of this type is composed mainly of a resin component as a base material and a thermally conductive filler dispersed therein. Since the thermally conductive material is required to have heat resistance (for example, 100° C. or higher), a silicone resin is often used as a resin component.

CITATION LIST

Patent Document

Patent Document 1: JP 2015-140395 A
Patent Document 2: JP 2010-242022 A
Patent Document 3: U.S. Pat. No. 7,208,192

Technical Problem

A thermally conductive material including a silicone resin has a problem that it can generate a siloxane gas (for example, a cyclic siloxane gas). Since the siloxane gas causes problems such as a contact failure of electronic equipment, a thermally conductive material including a non-silicone resin that does not generate a siloxane gas is desirable.

However, known thermally conductive materials including non-silicone resins have insufficient heat resistance and thus have room for improvement.

SUMMARY OF INVENTION

An object of the present invention is to provide a grease-like thermally conductive material and the like having excellent heat resistance using a non-silicone resin.

Solution to Problem

The solutions to the above problems are as follows. <1> A composition for a thermally conductive material including: an acrylic polymer (A) having at least two crosslinkable functional groups containing a carbon-carbon unsaturated bond; an acrylic polymer (B) having at least one of the crosslinkable functional groups; an anti-dripping agent; and a thermally conductive filler, a discharge amount being 1.50 g/min or more and 4.25 g/min or less as measured using a dispense controller under a predetermined discharge pressure condition.

<2> The composition for a thermally conductive material according to <1>, in which a ratio of a blend amount b of the acrylic polymer (B) to a blend amount a of the acrylic polymer (A) (mass ratio: b/a) is from 3 to 20.

<3> The composition for a thermally conductive material according to <1> or <2>, in which the crosslinkable functional group of the acrylic polymer (A) is at both ends, and the crosslinkable functional group of the acrylic polymer (B) is at one end.

<4> The composition for a thermally conductive material according to any one of <1> to <3>, in which the crosslinkable functional group is represented by chemical formula (1) below:

wherein R represents a hydrogen atom or an organic group having from 1 to 20 carbon atoms.

<5> The composition for a thermally conductive material according to any one of <1> to <4>, in which the anti-dripping agent includes a tetrafluoroethylene resin powder.

<6> The composition for a thermally conductive material according to any one of <1> to <5>, in which the composition for thermally conductive material further includes a dispersibility improver.

<7> A grease-like thermally conductive material formed by crosslinking the composition for thermally conductive material described in any one of <1> to <6> by heating.

Advantageous Effects of Invention

The present invention provides, for example, a grease-like thermally conductive material including a non-silicone resin and having excellent heat resistance.

DESCRIPTION OF EMBODIMENTS

Thermally Conductive Material

Figure 1:
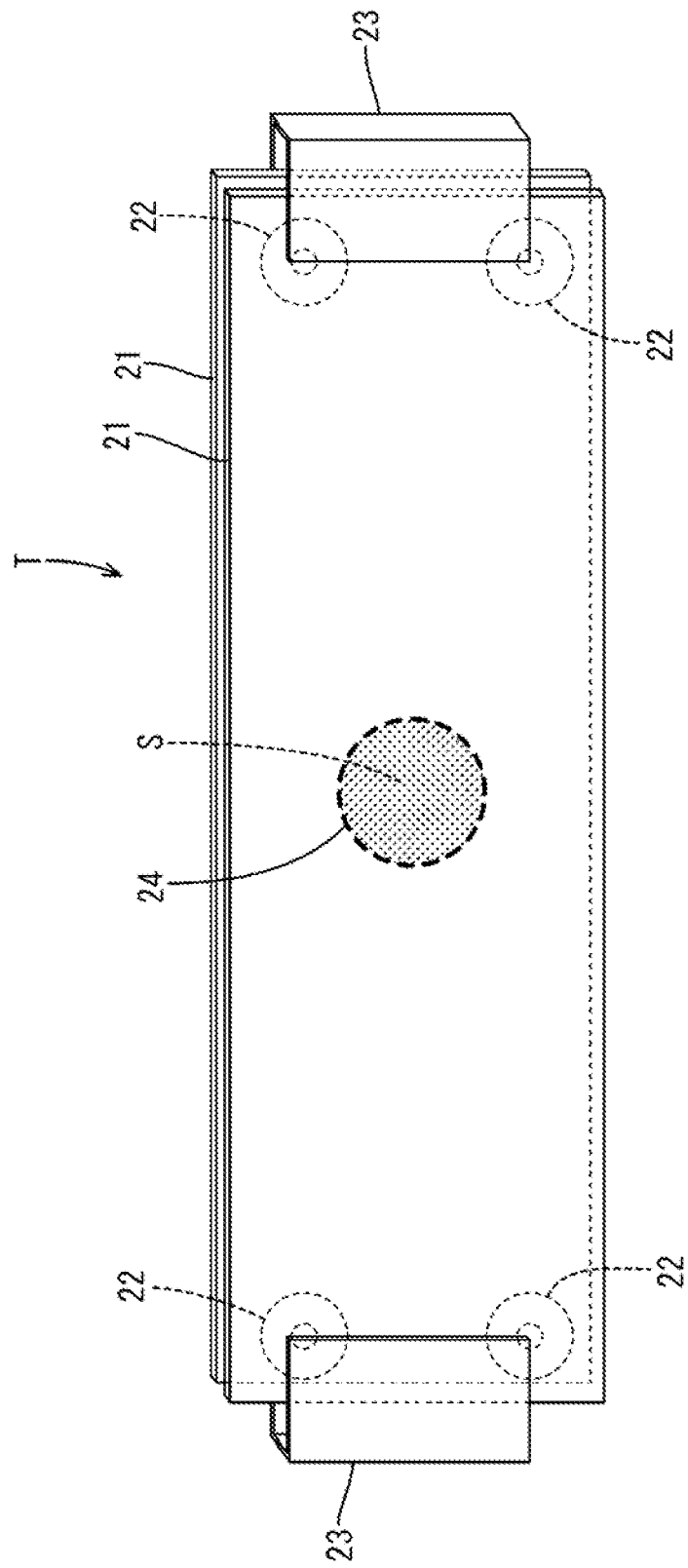
FIG. 1 is an illustration of a test piece used to evaluate shear resistance.

The thermally conductive material of the present embodiment is used in the form of being interposed between two objects (for example, a heat generating body and a heat radiating body). The thermally conductive material is grease-like and is formed by crosslinking the thermally conductive composition described below.

Composition for Thermally Conductive Material

The composition for the thermally conductive material is a composition used to form a thermally conductive material, and is softer and has a lower viscosity than the thermally conductive material. The composition for thermally conductive material mainly includes an acrylic polymer (A), an acrylic polymer (B), an anti-dripping agent, and a thermally conductive filler.

Acrylic Polymer (A)

The acrylic polymer (A) is an acrylic polymer that is used as a base material (base resin) of a composition for thermally conductive material and has at least two crosslinkable functional groups containing a carbon-carbon unsaturated bond. The acrylic polymer (A) preferably has the crosslinkable functional group at both ends.

The main chain of the acrylic polymer (A) is, for example, composed of a polymer of a (meth)acrylic acid monomer described below; or a polymer of a (meth)acrylic acid monomer and another vinyl monomer. In the present specification, "(meth)acrylic" means that it includes both acrylic and methacrylic.

Examples of the (meth)acrylic acid monomer include (meth)acrylic acid, methyl (meth)acrylate, ethyl (meth)acrylate, n-propyl (meth)acrylate, isopropyl (meth)acrylate, n-butyl (meth)acrylate, isobutyl (meth)acrylate, tert-butyl (meth)acrylate, n-pentyl (meth)acrylate, n-hexyl (meth)acrylate, cyclohexyl (meth)acrylate, n-heptyl (meth)acrylate, n-octyl (meth)acrylate, 2-ethylhexyl (meth)acrylate, nonyl (meth)acrylate, isononyl (meth)acrylate, decyl (meth)acrylate, dodecyl (meth)acrylate, phenyl (meth)acrylate, tolyl (meth)acrylate, benzyl (meth)acrylate, 2-methoxyethyl (meth)acrylate, 3-methoxybutyl (meth)acrylate, 2-hydroxyethyl (meth)acrylate, 2-hydroxypropyl (meth)acrylate, octadecyl (meth)acrylate, glycidyl (meth)acrylate, 2-aminoethyl (meth)acrylate, γ-(methacryloyloxypropyl) trimethoxysilane, ethylene oxide adduct of (meth)acrylic acid, trifluoromethylmethyl (meth)acrylate, 2-trifluoromethylethyl (meth)acrylate, perfluoroethyl methyl (meth)acrylate, 2-perfluoroethyl ethyl (meth)acrylate, perfluoroethyl perfluorobutyl methyl (meth)acrylate, 2-perfluoroethyl-2-perfluorobutyl ethyl (meth)acrylate, perfluoroethyl (meth)acrylate, perfluoromethyl (meth)acrylate, diperfluoromethyl methyl (meth)acrylate, 2,2-diperfluoromethylethyl (meth)acrylate, perfluoromethylperfluoroethylmethyl (meth)acrylate, 2-perfluoromethyl-2-perfluoroethylethyl (meth)acrylate, 2-perfluorohexylmethyl (meth)acrylate, 2-perfluorohexylethyl (meth)acrylate, (2-perfluorodecylmethyl (meth)acrylate, 2-perfluorodecylethyl (meth)acrylate, 2-perfluorohexadecylmethyl (meth)acrylate, and 2-perfluorohexadecylethyl (meth)acrylate. These may be used alone or in combination of two or more or them.

Examples of the other vinyl-monomer include aromatic vinyl monomers such as styrene, vinyl toluene, α-methylstyrene, chlorostyrene, styrene sulfonic acid and salts thereof; fluorine-containing vinyl monomers such as perfluoroethylene, perfluoropropylene, and vinylidene fluoride; silicon-containing vinyl monomers such as vinyltrimethoxysilane and vinyltriethoxysilane; maleic anhydride, maleic acid, monoalkyl and dialkyl esters of maleic acid; fumaric acid, monoalkyl and dialkyl esters of fumaric acid; maleimide monomers such as maleimide, methylmaleimide, ethylmaleimide, propylmaleimide, butylmaleimide, hexylmaleimide, octylmaleimide, dodecylmaleimide, stearylmaleimide, phenylmaleimide, and cyclohexylmaleimide; acrylonitrile monomers such as acrylonitrile and methacrylonitrile; amide group-containing vinyl monomers such as acrylamide and methacrylamide; vinyl esters such as vinyl acetate, vinyl propionate, vinyl pivalate, vinyl benzoate and vinyl cinnamate; alkenes such as ethylene and propylene; conjugated dienes such as butadiene and isoprene; vinyl chloride, vinylidene chloride, allyl chloride, and allyl alcohol. These may be used alone or in combination of two or more.

The method for synthesizing the main chain of the acrylic polymer (A) is not particularly limited as long as the object of the present invention is not impaired. For example, a free radical polymerization method may be used, but a living radical polymerization method is preferable because it easily reduces the molecular weight distribution (the ratio (Mw/Mn) of the weight average molecular weight (Mw) to the number average molecular weight (Mn)). The living radical polymerization method (particularly the atom transfer radical polymerization method) is preferable because it can obtain a polymer having a narrow molecular weight distribution and a low viscosity and because it can introduce a monomer having a specific functional group to almost any position in a polymer.

The crosslinkable functional group includes a structure containing at least a carbon-carbon unsaturated bond and is composed of, for example, the structure (functional group) represented by the chemical formula (1) below:

$$-\text{OC(O)C(R)}=\text{CH}_2 \quad (1)$$

wherein R represents a hydrogen atom or an organic group having from 1 to 20 carbon atoms.

The structure (functional group) represented by the chemical formula (1) is preferably, for example, an acryloyl group or a methacryloyl group and is particularly preferably an acryloyl group.

Acrylic Polymer (B)

The acrylic polymer (B) is an acrylic polymer that is used (used in combination with) the acrylic polymer (A) as the base material (base resin) of the composition for thermally conductive material and has at least one crosslinkable functional group containing a carbon-carbon unsaturated bond. The acrylic polymer (B) preferably has the crosslinkable functional group at one end. The acrylic polymer (B) preferably has a lower viscosity and a smaller molecular weight (weight average molecular weight and number average molecular weight) than those of the acrylic polymer (A).

The acrylic polymer (B) is frequently used as a base material (base resin) of the composition for thermally conductive material than the acrylic polymer (A). For example, in the composition for thermally conductive material, the ratio of the blend amount b of the acrylic polymer (B) to the blend amount a of the acrylic polymer (A) (mass ratio: b/a) is preferably 3 or more, more preferably 4 or more, preferably 20 or less, and more preferably 15 or less.

The main chain of the acrylic polymer (B) is basically, similar to the acrylic polymer (A), composed of a polymer of the (meth)acrylic acid monomer; or a polymer of the (meth)acrylic acid monomer and the other vinyl monomer. The method for synthesizing the main chain of the acrylic polymer (B) is basically the same as that for the main chain of the acrylic polymer (A). However, the main chain of the acrylic polymer (B) is preferably shorter (molecular weight is smaller) than the acrylic polymer (A).

The content of the crosslinkable functional group contained in the acrylic polymer (B) is the same as the acrylic polymer (A). The crosslinkable functional group of the acrylic polymer (B) includes a structure containing at least a carbon-carbon unsaturated bond and is composed of, for example, the structure (functional group) represented by the chemical formula (1) above. In the crosslinkable functional group of the acrylic polymer (B), the structure (functional group) represented by the chemical formula (1) is preferably an acryloyl group or a methacryloyl group and particularly preferably an acryloyl group.

Anti-Dripping Agent

The anti-dripping agent is dispersed in the composition for thermally conductive material (base resin) and has the function of adjusting the viscosity of the composition for thermally conductive material. The anti-dripping agent may be, for example, a tetrafluoroethylene resin (PTFE) powder. When the anti-dripping agent is melt-kneaded and dispersed in the composition for thermally conductive material (base resin), it is easily fiberized and has a function of easily forming a network structure in the composition for thermally conductive material (and the thermally conductive material obtained therefrom). Specific examples of the commercially available anti-dripping agent include product name "Polyfron (trade name) MPA FA-500H" (available from Daikin Industries, Ltd.).

The blend amount of the anti-dripping agent in the composition for thermally conductive material is not particularly limited as long as the object of the present invention is not impaired. For example, the blend amount is preferably 0.25 parts by mass or more, preferably 0.45 parts by mass or more, preferably 0.8 parts by mass or less, and more preferably 0.55 parts by mass or less, relative to a total of 100 parts by mass of the acrylic polymer (A) and the acrylic polymer (B). When the blend amount of the anti-dripping agent is within this range, heat resistance (shear resistance) of the thermally conductive material obtained from the composition for thermally conductive material is easily ensured.

Dispersibility Improver

The composition for thermally conductive material may further include a dispersibility improver. The dispersibility improver has a function of uniformly dispersing a thermally conductive filler in the composition for thermally conductive material (base resin). The dispersibility improver may be, for example, a silane coupling agent or a surfactant and is preferably a silane coupling agent.

The blend amount of the dispersibility improver in the composition for thermally conductive material is not particularly limited as long as the object of the present invention is not impaired. For example, the blend amount is preferably 0.5 parts by mass or more and preferably 2 parts by mass or less, relative to a total of 100 parts by mass of the acrylic polymer (A) and the acrylic polymer (B) When the blend amount of the dispersibility improver is within this range, during mixing of the composition for thermally conductive material (base resin) with the thermally conductive filler, aggregation of the thermally conductive filler with the composition for thermally conductive material (base resin) is suppressed, whereby the mixing can be done easily. This improves the shape stability of the thermally conductive material obtained from the composition for thermally conductive material, and thus shear resistance is easily ensured.

Thermally Conductive Filler

Examples of the thermally conductive filler include silicon carbide, alumina, silica, silicon nitride, and boron nitride. Other examples include surface metal-coated particles composed of cores coated with a metal and made of hollow particles (for example, glass balloons) or of resin particles. The thermally conductive filler may be used alone or in combination of two or more.

The average particle size of the thermally conductive filler is not particularly limited as long as it will not impair the object of the present invention and may be, for example, from 0.5 μm to 100 μm. A plurality of thermally conductive fillers having different particle sizes may be used in combination.

The blend amount of the thermally conductive filler in the composition for thermally conductive material is not particularly limited as long as the object of the present invention is not impaired. For example, the blend amount is in a range of 200 parts by mass or more and 5000 parts by mass or less, relative to a total of 100 parts by mass of the acrylic polymer (A) and the acrylic polymer (B).

Other Components

The composition for thermally conductive material may further include a crosslinking initiator. The crosslinking initiator generates radicals by receiving heat or light and mainly has a function of reacting the crosslinkable functional group of the acrylic polymer (A) and the crosslinkable functional group of the acrylic polymer (B). When radicals are generated by the crosslinking initiator, the crosslinkable functional groups are bonded (polymerized) to crosslink the acrylic polymer (A) and the acrylic polymer (B) and crosslink the acrylic polymers (B) together.

Examples of the crosslinking initiator include organic peroxides such as ketone peroxides, diacyl peroxides, hydroperoxides, dialkyl peroxides, peroxyketals, alkyl peresters, and percarbonates. Among these, percarbonates are particularly preferable.

The crosslinking initiator may be a photoreactive one that generate radicals by receiving light (for example, ultraviolet light) or thermally reactive one that generates radicals by receiving heat. Since the thermally conductive filler included in the composition for thermally conductive material may hinder light for activating the crosslinking initiator, using a thermally reactive crosslinking initiator is preferable.

When a thermally reactive crosslinking initiator is used, the reaction temperature is not particularly limited as long as the object of the present invention is not impaired. For example, the reaction temperature (heating temperature) is preferably 100° C. or higher from the perspective of ensuring storage stability of the composition for thermally conductive material.

The blend amount of the crosslinking initiator in the composition for thermally conductive material is not particularly limited as long as the object of the present invention is not impaired. For example, it is preferably 0.035 parts by mass or more, relative to a total of 100 parts by mass of the acrylic polymer (A) and the acrylic polymer (B). The upper limit of the blend amount of the crosslinking initiator is, for example, preferably 0.1 parts by mass or less, more preferably 0.08 parts by mass or less, and even more preferably 0.065 parts by mass or less, relative to the above total of 100 parts by mass. When the blend amount of the crosslinking initiator is within this range, heat resistance (shear resistance) of the thermally conductive material obtained from the composition for thermally conductive material is easily ensured.

The composition for thermally conductive material may further include an antioxidant. Examples of the antioxidant include phenol-based antioxidants, phosphorus-based processing heat stabilizers, lactone-based processing heat stabilizers, sulfur-based heat-resistant stabilizers, phenol-phosphorus-based antioxidants. Among these, phenol-based antioxidants are preferable, and hindered phenol-based antioxidants are particularly preferable.

The blend amount of the antioxidant in the composition for thermally conductive material is not particularly limited as long as the object of the present invention is not impaired. For example, the blend amount is 0.5 parts by mass or more and 2 parts by mass or less, relative to a total of 100 parts by mass of the acrylic polymer (A) and the acrylic polymer (B).

As necessary, as long as the object of the present invention is not impaired, plasticizers, colorants, fillers, fillings, and the like may be added to the composition for thermally conductive material.

The composition for thermally conductive material has a low viscosity and can maintain a grease-like state even if it contains no solvent such as an organic solvent. Therefore, the organic solvent is not an essential component and does not need to be actively added to the composition for thermally conductive material. However, as long as the object of the present invention is not impaired, an organic solvent may be included in the composition for thermally conductive material.

Viscosity of the Composition for Thermally Conductive Material

The viscosity of the composition for thermally conductive material can be determined by, for example, a discharge amount measured using a dispense controller under a predetermined discharge pressure condition. The discharge amount of the composition for thermally conductive material is 1.50 g/m or more and 4.25 g/m or less. When the discharge amount of the composition for thermally conductive material is within this range, heat resistance (shear resistance) of the thermally conductive material obtained from the composition for thermally conductive material is ensured. The discharge pressure generally ranges from 0.1 MPa to 1.0 MPa, corresponding to the pressures from that of being operated manually by an operator to that of being operated with mechanical equipment such as a dispense controller.

Thermally Conductive Material

The thermally conductive material of the present embodiment is formed by crosslinking the composition for thermally conductive material. When a crosslinking reaction occurs in the composition for thermally conductive material, the acrylic polymer (A) and the acrylic polymer (B); and the acrylic polymers (B) in the composition for thermally conductive material are bonded (polymerized), and finally, a structure in which the acrylic polymers are gently crosslinked is formed in the thermally conductive material. It is presumed that the crosslinking density of the entire acrylic polymer (acrylic polymer (A), (B)) is reasonably low and that many free chains mainly derived from the acrylic polymer (B) are present in the thermally conductive material. Therefore, a grease-like state is maintained even in the thermally conductive material.

When the composition for thermally conductive material includes a thermally reactive crosslinking initiator, a thermally conductive material is obtained by heat-treating the composition for thermally conductive material at a predetermined temperature. The thermally conductive material is used, for example, in the form of being interposed between a heat generating body and a heat radiating body. In some cases, the composition for thermally conductive material may be interposed between two objects and, for example, allowed to naturally react by heat, thereby forming a thermally conductive material from the composition for thermally conductive material.

The thermal conductivity of the thermally conductive material is set to be, for example, from 2 W/m·K to 3 W/m·K.

Since the thermally conductive material of the present embodiment includes an acrylic resin as the base resin, it does not have, for example, the problem of generating siloxane gas. Furthermore, the thermally conductive material has excellent shear resistance because sagging (displacement by shear) from the installation position (for example, the gap between objects) caused by softening or the like under high temperature conditions (for example, 125° C. or higher) is suppressed.

The rate of change between the viscosity immediately after application of the thermally conductive material to the object and the viscosity after 4 hours from application is within 10%. The rate of change is calculated from the following formula (2):

Rate of change of viscosity of thermally conductive material (%)={(viscosity after application)−(viscosity before application)}/(viscosity before application)×100    (2)

Embodiment

The present invention will be described below in more detail based on examples. The present invention is not limited to these examples.

Examples 1 to 13 and Comparative Examples 1 to 3

Manufacture of Composition for Thermally Conductive Material

The acrylic polymer (A), acrylic polymer (B), crosslinking initiator, anti-dripping agent, antioxidant, dispersibility improver, thermally conductive filler 1, thermally conductive filler 2, thermally conductive filler 3, thermally conductive filler 4, and thermally conductive filler 5 were blended in the blend amounts (parts by mass) shown in Tables 1 to 3 and were mixed using a kneader or the like to manufacture the compositions for thermally conductive material of Examples 1 to 13 and Comparative Examples 1 to 3.

As the acrylic polymer (A), product name "KANEKA XMAP (trade name) RC100C" (available from Kaneka Corporation, acrylic polymer with acryloyl groups at both ends, viscosity: 160 Pa·s, specific gravity: 1.05, glass transition temperature: −50° C.) was used.

As the acrylic polymer (B), product name "KANEKA XMAP (trade name) MM110C" (available from Kaneka Corporation, reactive acrylic macromonomer with an acryloyl group at one end, viscosity: 44 Pa·s, specific gravity: 1.05, glass transition temperature: −50° C.) was used.

As the crosslinking initiator, product name "PERKADOX (trade name) 16" (available from Kayaku Akzo Corporation, di-(4-tert-butylcyclohexyl) peroxydicarbonate (mixture)) was used.

As the anti-dripping agent, product name "Polyfron (trade name) MPA FA-500H" (available from Daikin Industries, Ltd., PTFE (tetrafluoroethylene resin) powder, apparent density: 0.45 g/ml, specific gravity: 2.17, melting point: 325° C.) was used.

As the antioxidant, product name "AO-60" (available from ADEKA Corporation, phenolic antioxidant, pentaerythritol tetrakis [3-(3,5-di-tert-butyl-4-hydroxyphenyl) propionate]) was used.

As the dispersibility improver, product name "KBE-502" (available from Shin-Etsu Chemical Co., Ltd., silane coupling agent, 3-methacryloxypropyltrimethoxysilane) was used.

As the thermally conductive filler 1, product name "AC2000-SML" (available from Admatechs Company Limited, alumina particles, average particle size: 0.6 μm, density: 3.6 g/cm$^3$) was used. The average particle size of the thermally conductive filler 1 was measured using a laser diffraction/scattering particle size distribution analyzer ("LA-750", available from HORIBA, Ltd.).

As the thermally conductive filler 2, product name "A5-C1-SM" (available from Admatechs Company Limited, alumina particles, average particle size: 5.5 μm, density: 3.6 g/cm$^3$) was used.

As the thermally conductive filler 3, product name "AX75-125" (available from Nippon Steel & Sumikin Materials Co., Ltd., alumina particles, average particle size: 75 μm, density: 3.87 g/cm$^3$) was used.

As the thermally conductive filler 4, product name "AO-509" (available from Admatechs Company Limited, alumina particles, average particle size: 10 μm, density: 3.8 g/cm$^3$) was used.

As the thermally conductive filler 5, product name "AX3-75" (available from Nippon Steel & Sumikin Materials Co., Ltd., alumina particles, average particle size: 3 μm, density: 3.87 g/cm$^3$) was used.

Measurement of Discharge Amount

The compositions of Examples and Comparative Examples stored for 4 hours in an environment of 25° C. were measured for the mass (g) discharged within a predetermined time at a discharge pressure of 0.48 MPa and a discharge time of 1 minute, thereby determining the discharge amount (g/min) of the compositions. The results are shown in Table 1 to Table 3. The equipment used is as follows.

Dispense controller: product name "1500XL" (available from San-Ei Tech Ltd.)

Syringe: product name "SB-30" (available from Unicontrols Co., Ltd., inner diameter of nozzle: 2 mm, inner diameter of the part containing the composition (i.e. chemical solution part): 22.5 mm)

Shear Resistance Evaluation 1: High Temperature Test

Figure 2:
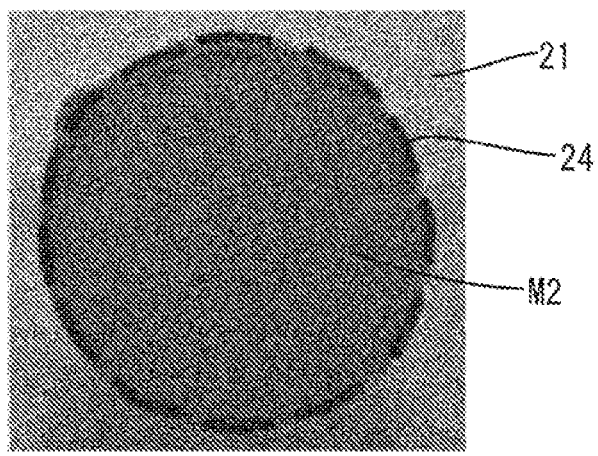
FIG. 2 is a photograph of the thermally conductive material of Example 2 that caused no sagging in the evaluation 2 (heat cycle test).

The thermally conductive materials obtained by heat-treating (100° C., 10 minutes) the compositions of Examples 1 to 11 and Comparative Examples 1 to 3 were evaluated for shear resistance by the method described below. FIG. 1 illustrates a test piece T used to evaluate the shear resistance. As illustrated in FIG. 1, two glass plates (glass slides) 21 were prepared, and 1 g of the thermally conductive material (thermally conductive material in a state before the test) S was put between them with a spacer (a washer having a thickness of 1.0 mm) 22 interposed therebetween, and the thermally conductive material S in a circular shape was sandwiched between the two glass plates 21. The glass plates 21 were secured using a clip 23. In order to indicate the initial position of the thermally conductive material S, the outline of the thermally conductive material S was indicated on the surface of the glass plate 21 with an oil-based marker. In FIG. 2, an outline 24 representing the initial position of the thermally conductive material S is indicated by a broken line. The test piece T thus obtained was placed in a thermal shock tester (product name "TSE-11-A", available from Espec Co., Ltd.) so that the flat circular thermally conductive material S stood upright in the vertical direction, and left for one day (24 hours) at a temperature condition of 125° C. Thereafter, the amount of sagging (displacement by shear) of the position of the thermally conductive material S from the original position (initial position) was judged based on the evaluation criteria shown below. The results are shown in Table 1 and Table 2.

Evaluation Criteria

"Good" No sagging (when the amount of displacement is within 5%)

"Marginal" Slightly sagged (when the amount of displacement is less than 50%)

"Fail" Sagged (when the amount of displacement is 50% or more)

Shear Resistance Evaluation 2: Heat Cycle Test

The shear resistance of the compositions (thermally conductive materials) of Examples 1 to 11 and Comparative Examples 1 to 3 was evaluated by the same method and evaluation criteria as in the above shear resistance evaluation 1, except that a heat cycle test (number of cycles: 100 times) was alternately repeated at −40° C. and 125° C. (each 30 minutes). The results are shown in Table 1 and Table 2.

Shear Resistance Evaluation 3: High Temperature Test

The shear resistance of the compositions (thermally conductive materials) of Examples 12 and 13 was evaluated by the same method and evaluation criteria as in the above shear resistance evaluation 1, except that the thickness of the spacer 22 was changed to 3.0 mm as illustrated in FIG. 1. The results are shown in Table 3.

Shear Resistance Evaluation 4: Heat Cycle Test

In the thermal shock tester, the heat cycle test (number of cycles: 100 times) was alternately repeated at 0° C. and 80° C. (each 30 minutes), and the thickness of the spacer 22 illustrated in FIG. 1 was changed to 3.0 mm. Except this, the shear resistance of the compositions (thermally conductive materials) in Examples 12 and 13 was evaluated by the same method and evaluation criteria as in the above shear resistance evaluation 1. The results are shown in Table 3.

TABLE 1

| | | | Example 1 | Example 2 | Example 3 | Example 4 | Comparative Example 1 | Comparative example 2 | Comparative Example 3 |
|---|---|---|---|---|---|---|---|---|---|
| Composition | Blend amount (part by mass) | Acrylic polymer (A) | 10 | 10 | 10 | 10 | 10 | 10 | 10 |
| | | Acrylic polymer (B) | 90 | 90 | 90 | 90 | 90 | 90 | 90 |
| | | Crosslinking initiator | 0.05 | 0.05 | 0.05 | 0.05 | 0.05 | 0.05 | 0 |
| | | Anti-dripping agent | 0.6 | 0.5 | 0.4 | 0.3 | 0.2 | 0 | 0 |
| | | Antioxidant | 1 | 1 | 1 | 1 | 1 | 1 | 1 |
| | | Thermally conductive filler 1 | 175 | 175 | 175 | 175 | 175 | 175 | 175 |
| | | Thermally conductive filler 2 | 280 | 280 | 280 | 280 | 280 | 280 | 280 |

TABLE 1-continued

|  |  |  | Example 1 | Example 2 | Example 3 | Example 4 | Comparative Example 1 | Comparative example 2 | Comparative Example 3 |
|---|---|---|---|---|---|---|---|---|---|
|  |  | Thermally conductive filler 3 | 70 | 70 | 70 | 70 | 70 | 70 | 70 |
|  |  | Discharge amount (g/min) | 2.03 | 3.21 | 3.85 | 4.14 | 4.35 | 4.58 | 4.77 |
|  |  | Application workability | Marginal | Good | Good | Good | Good | Good | Good |
| Shear resistance | Evaluation 1 | High temperature test 125° C./1 day 1 mm spacer | Good | Good | Good | Good | Marginal | Fail | Fail |
|  | Evaluation 2 | Heat cycle test (from −40° C. to 125° C.) 1 mm spacer | Good | Good | Marginal | Marginal | Fail | Fail | Fail |

TABLE 2

|  |  |  | Example 5 | Example 6 | Example 7 | Example 8 | Example 9 | Example 10 | Example 11 |
|---|---|---|---|---|---|---|---|---|---|
| Composition | Blend amount (part by mass) | Acrylic polymer (A) | 10 | 10 | 10 | 10 | 10 | 5 | 20 |
|  |  | Acrylic polymer (B) | 90 | 90 | 90 | 90 | 90 | 95 | 80 |
|  |  | Crosslinking initiator | 0.06 | 0.04 | 0.03 | 0.02 | 0 | 0.05 | 0.05 |
|  |  | Anti-dripping agent | 0.5 | 0.5 | 0.5 | 0.5 | 0.5 | 0.5 | 0.5 |
|  |  | Antioxidant | 1 | 1 | 1 | 1 | 1 | 1 | 1 |
|  |  | Thermally conductive filler 1 | 175 | 175 | 175 | 175 | 175 | 175 | 175 |
|  |  | Thermally conductive filler 2 | 280 | 280 | 280 | 280 | 280 | 280 | 280 |
|  |  | Thermally conductive filler 3 | 70 | 70 | 70 | 70 | 70 | 70 | 70 |
|  |  | Discharge amount (g/min) | 3.03 | 3.33 | 3.42 | 3.57 | 3.66 | 3.81 | 1.78 |
|  |  | Application workability | Good | Good | Good | Good | Good | Good | Marginal |
| Shear resistance | Evaluation 1 | High temperature test 125° C./1 day 1 mm spacer | Good | Good | Good | Good | Good | Marginal | Good |
|  | Evaluation 2 | Heat cycle test (from −40° C. to 125° C.) 1 mm spacer | Good | Good | Marginal | Marginal | Marginal | Marginal | Good |

TABLE 3

|  |  |  | Example 12 | Example 13 |
|---|---|---|---|---|
| Composition | Blend amount (part by mass) | Acrylic polymer (A) | 10 | 10 |
|  |  | Acrylic polymer (B) | 90 | 90 |
|  |  | Crosslinking initiator | 0.1 | 0.1 |
|  |  | Anti-dripping agent | 0.28 | 0.28 |
|  |  | Antioxidant | 1 | 1 |
|  |  | Dispersibility improver | 0 | 1 |
|  |  | Thermally conductive filler 1 | 106 | 106 |
|  |  | Thermally conductive filler 2 | 0 | 0 |
|  |  | Thermally conductive filler 3 | 106 | 106 |
|  |  | Thermally conductive filler 4 | 423 | 423 |
|  |  | Thermally conductive filler 5 | 141 | 141 |
|  |  | Discharge amount (g/min) | 2.37 | 2.46 |
|  |  | Application workability | Good | Good |
| Shear resistance | Evaluation 3 | High temperature test 125° C./1 day 3 mm spacer | Good | Good |
|  | Evaluation 4 | Heat cycle test (0° C. to 80° C.) 3 mm spacer | Marginal | Good |

As shown in Table 1, it was confirmed that the thermally conductive material obtained from the composition of Example 1 to 4 caused no sagging in the evaluation 1 (high temperature test) and exhibited excellent shear resistance. Examples 1 and 2 caused no sagging in the evaluation 2 (heat cycle test) and exhibited particularly excellent shear resistance.

Figure 3:
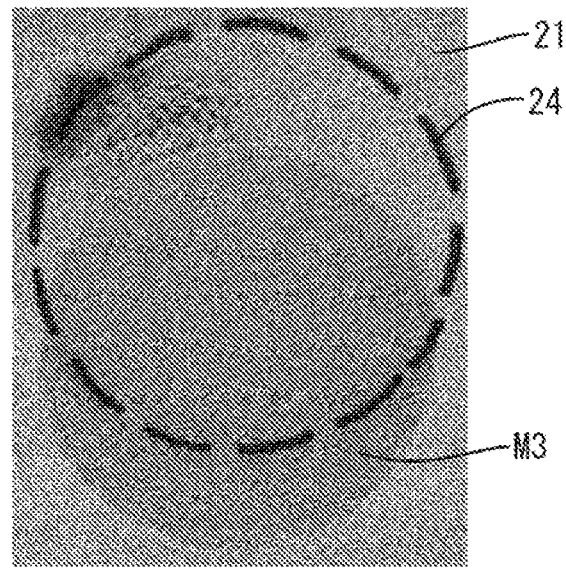
FIG. 3 is a photograph of the thermally conductive material of Example 3 that caused slight sagging in the evaluation 2 (heat cycle test).

FIG. 2 is a photograph of a thermally conductive material M2 (the thermally conductive material M2 after test) of Example 2 that caused no sagging in the evaluation 2 (heat cycle test), and FIG. 3 is a photograph of a thermally conductive material M3 (the thermally conductive material M3 after test) of Example 3 that caused slight sagging in the evaluation 2 (heat cycle test).

Figure 4:
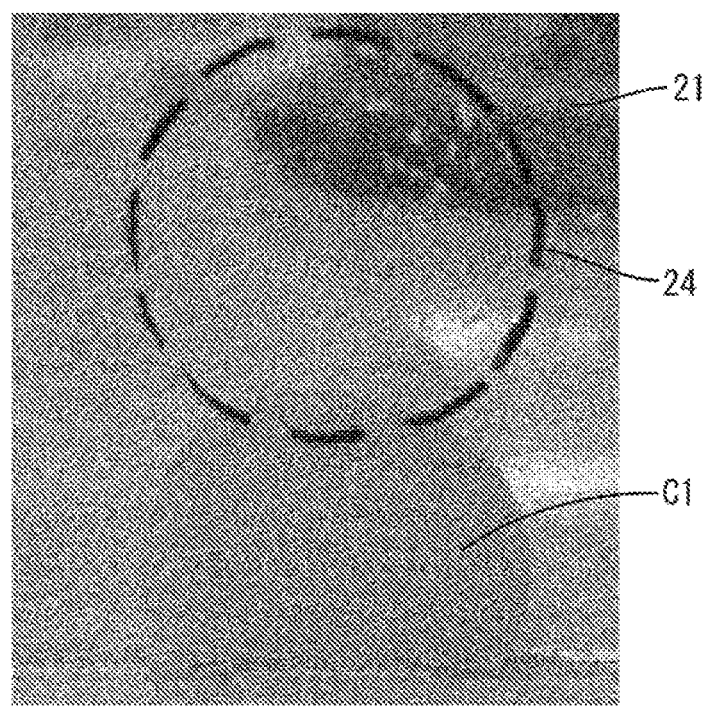
FIG. 4 is a photograph of the thermally conductive material of Comparative Example 1 that caused sagging in the evaluation 2 (heat cycle test).

In contrast, the thermally conductive material obtained from the composition of Comparative Example 1 caused slight sagging in the evaluation 1 (high temperature test). Furthermore, in Comparative Example 1, sagging occurred in the evaluation 2 (heat cycle test). FIG. 4 is a photograph of a thermally conductive material C1 (thermally conductive material C1 after test) of Comparative Example 1 in a sagged state in the evaluation 2 (heat cycle test).

Furthermore, the thermally conductive materials obtained from the compositions of Comparative Examples 2 and 3 caused sagging in both the evaluation 1 and evaluation 2.

Furthermore, as indicated in Table 2, the thermally conductive materials obtained from the compositions of Examples 5 to 11 did not cause sagging in Examples 5 to 9 and 11 in the evaluation 1, and caused slight sagging in Example 10. In the evaluation 2, no sagging occurred in Examples 5, 6, and 11, but slight sagging occurred in Examples 7 to 10.

Furthermore, as indicated in Table 3, the thermally conductive materials obtained from the compositions of Examples 12 and 13 caused no sagging in the evaluation 3. Furthermore, in the evaluation 4, slight sagging occurred in Example 12, but no sagging occurred in Example 13.

In the shear resistance evaluation, the spaces between the glass plates were 1.0 mm and 3.0 mm. Sagging more likely occurred when the space between the glass plates was 3.0 mm. Therefore, when both were compared on the same conditions except the space between the glass plates, it was confirmed that the one with a glass plate spacing of 3.0 mm was inferior in shear resistance.

On the other hand, when the gap between the glass plates was reduced from 3.0 mm to 1.0 mm, it was confirmed that the sagging was small and the shear resistance was excellent.

APPLICATION WORKABILITY

In the application of the composition for thermally conductive material between a heat generating body and a heat radiating body, if the discharge amount from the syringe containing the composition is small, the application workability will decline. When the discharge amount of the composition is 3 g or more, the application workability is good, but when the discharge amount of the composition is less than 3 g, workability decreases because the discharge of the amount required for thermal conduction takes time. Therefore, the compositions of Examples and Comparative Examples were evaluated for their application workability using a predetermined syringe. In Table 1 and Table 2, when the discharge amount of the composition is 3 g or more (when workability is good), it is expressed as "Good", and when the discharge amount of the composition is less than 3 g (when workability is slightly good), it is expressed as "Marginal". The above syringe is the same as that used in the "measurement of discharge amount" described above.

Relationship Between Discharge Amount and Shear Resistance of Composition

When the discharge amount of the composition is less than 3.03 g/min, no sagging occurs in the heat cycle test (evaluation 2), but application workability of the thermally conductive material is poor. Furthermore, when the discharge amount of the composition is 3.03 g/min or more and 3.33 g/min or less, sagging does not occur in the heat cycle test (evaluation 2). Furthermore, when the discharge amount of the composition is more than 3.33 g/min and 4.14 g/min or less, slight sagging occurs in the heat cycle test (evaluation 2). Furthermore, when the discharge amount of the composition exceeds 4.35 g/min, sagging occurs in the heat cycle test (evaluation 2).

REFERENCE SIGNS LIST

S Thermally conductive material (before test)
M3, M4 Thermally conductive material (after test)
21 Glass plate
22 Spacer
23 Clip
24 Outline representing the initial position of the thermally conductive material

The invention claimed is:

1. A composition for thermally conductive material comprising: an acrylic polymer (A) having at least two crosslinkable functional groups containing a carbon-carbon unsaturated bond; an acrylic polymer (B) having at least one of the crosslinkable functional groups; an anti-dripping agent; and a thermally conductive filler, a discharge amount being 1.50 g/min or more and 4.25 g/min or less as measured using a dispense controller under a predetermined discharge pressure condition.

2. The composition for thermally conductive material according to claim 1, wherein a ratio of a blend amount b of the acrylic polymer (B) to a blend amount a of the acrylic polymer (A) (mass ratio: b/a) is from 3 to 20.

3. The composition for thermally conductive material according to claim 1, wherein the crosslinkable functional group of the acrylic polymer (A) is at both ends, and the crosslinkable functional group of the acrylic polymer (B) is at one end.

4. The composition for thermally conductive material according to claim 1, wherein the crosslinkable functional group is represented by chemical formula (1) below:

$$—OC(O)C(R)=CH_2 \quad (1)$$

wherein R represents a hydrogen atom or an organic group having from 1 to 20 carbon atoms.

5. The composition for thermally conductive material according to claim 1, wherein the anti-dripping agent comprises a tetrafluoroethylene resin powder.

6. The composition for thermally conductive material according to claim 1, wherein the composition for thermally conductive material further comprises a dispersibility improver.

7. A grease-like thermally conductive material formed by crosslinking the composition for thermally conductive material described in claim 1 by heating.

8. The composition for thermally conductive material according to claim 2, wherein the crosslinkable functional group of the acrylic polymer (A) is at both ends, and the crosslinkable functional group of the acrylic polymer (B) is at one end.

9. The composition for thermally conductive material according to claim 2, wherein the crosslinkable functional group is represented by chemical formula (1) below:

$$—OC(O)C(R)=CH_2 \qquad (1)$$

wherein R represents a hydrogen atom or an organic group having from 1 to 20 carbon atoms.

10. The composition for thermally conductive material according to claim 2, wherein the anti-dripping agent comprises a tetrafluoroethylene resin powder.

11. The composition for thermally conductive material according to claim 2, wherein the composition for thermally conductive material further comprises a dispersibility improver.

12. A grease-like thermally conductive material formed by crosslinking the composition for thermally conductive material described in claim 2.

* * * * *